United States Patent
Jeng et al.

(10) Patent No.: US 8,883,637 B2
(45) Date of Patent: Nov. 11, 2014

(54) SYSTEMS AND METHODS FOR CONTROLLING ETCH SELECTIVITY OF VARIOUS MATERIALS

(75) Inventors: Esther Jeng, Los Altos, CA (US); Anand Chandrashekar, Fremont, CA (US); Raashina Humayun, Fremont, CA (US); Michal Danek, Cupertino, CA (US); Ronald Powell, Portola Valley, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 13/536,095

(22) Filed: Jun. 28, 2012

(65) Prior Publication Data

US 2013/0005140 A1    Jan. 3, 2013

Related U.S. Application Data

(60) Provisional application No. 61/503,271, filed on Jun. 30, 2011.

(51) Int. Cl.
| | |
|---|---|
| H01L 21/44 | (2006.01) |
| H01L 21/4763 | (2006.01) |
| H01L 21/768 | (2006.01) |
| C23C 16/04 | (2006.01) |
| H01L 21/3213 | (2006.01) |
| H01L 21/285 | (2006.01) |

(52) U.S. Cl.
CPC ........ *H01L 21/76877* (2013.01); *C23C 16/045* (2013.01); *H01L 21/32136* (2013.01); *H01L 21/28556* (2013.01); *H01L 21/76865* (2013.01)
USPC ............ 438/672; 438/648; 438/656; 438/629

(58) Field of Classification Search
USPC ......... 438/672, 689–691, 694, 697, 700, 702, 438/703, 705–707, 714, 738, 758, 629, 648, 438/652, 653, 656; 257/E21.585, E21.311
See application file for complete search history.

(56) References Cited

U.S. PATENT DOCUMENTS

| | | | | |
|---|---|---|---|---|
| 5,514,622 | A | * | 5/1996 | Bornstein et al. ............. 438/628 |
| 5,654,234 | A | * | 8/1997 | Shih et al. ..................... 438/643 |

(Continued)

FOREIGN PATENT DOCUMENTS

| | | |
|---|---|---|
| KR | 20040087406 A | 10/2004 |
| KR | 100458295 B1 | 11/2004 |
| KR | 20110014069 A | 2/2011 |

OTHER PUBLICATIONS

Notification of Transmittal of The International Search Report and The Written Opinion of The International Searching Authority, or The Declaration dated Feb. 1, 2013 in reference to PCT/US2012/044820 (11 pgs).

*Primary Examiner* — Mary Wilczewski
*Assistant Examiner* — Erik T Peterson

(57) ABSTRACT

A method for filling a recessed feature of a substrate includes a) at least partially filling a recessed feature of a substrate with tungsten-containing film using at least one of chemical vapor deposition (CVD) and atomic layer deposition (ALD); b) at a predetermined temperature, using an etchant including activated fluorine species to selectively etch the tungsten-containing film more than an underlying material of the recessed feature without removing all of the tungsten-containing film at a bottom of the recessed feature; and c) filling the recessed feature using at least one of CVD and ALD.

16 Claims, 15 Drawing Sheets

(56) References Cited

U.S. PATENT DOCUMENTS

| | | | |
|---|---|---|---|
| 5,786,272 A * | 7/1998 | Marangon et al. | 438/628 |
| 6,043,151 A * | 3/2000 | Gonzalez et al. | 438/672 |
| 6,309,977 B1 * | 10/2001 | Ting et al. | 438/706 |
| 6,475,907 B1 * | 11/2002 | Taguwa | 438/648 |
| 6,635,965 B1 | 10/2003 | Lee et al. | |
| 6,683,000 B2 * | 1/2004 | Fukui et al. | 438/672 |
| 7,141,494 B2 | 11/2006 | Lee et al. | |
| 8,119,527 B1 | 2/2012 | Chandrashekar et al. | |
| 8,124,531 B2 | 2/2012 | Chandrashekar et al. | |
| 2007/0049017 A1 * | 3/2007 | Hsieh | 438/672 |
| 2007/0298607 A1 | 12/2007 | Andryushchenko et al. | |
| 2008/0254623 A1 | 10/2008 | Chan et al. | |
| 2010/0144140 A1 * | 6/2010 | Chandrashekar et al. | 438/669 |
| 2010/0267230 A1 | 10/2010 | Chandrashekar et al. | |
| 2011/0059608 A1 | 3/2011 | Gao et al. | |
| 2011/0089484 A1 * | 4/2011 | Lim et al. | 257/330 |
| 2011/0159690 A1 * | 6/2011 | Chandrashekar et al. | 438/675 |
| 2012/0115329 A1 | 5/2012 | Chandrashekar et al. | |

* cited by examiner

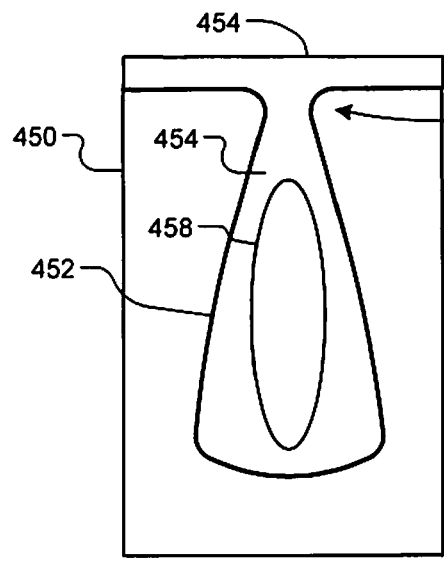 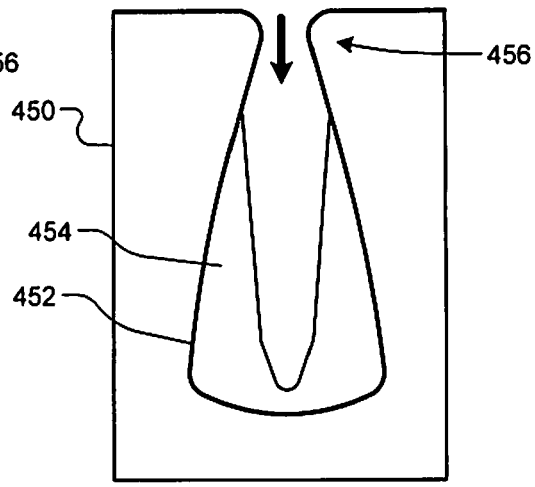
FIG. 16A        FIG. 16B
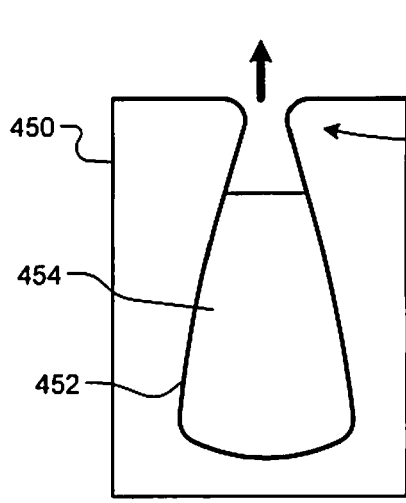 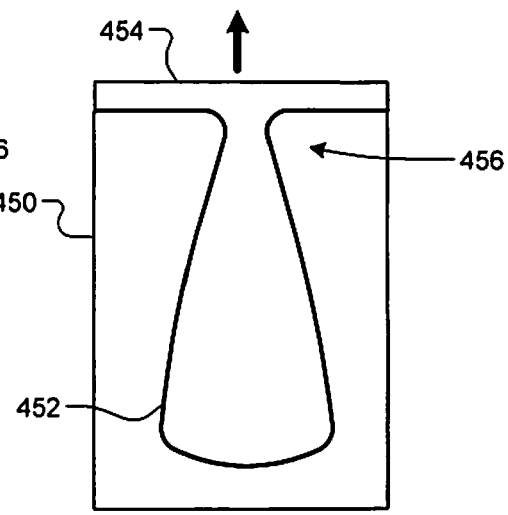
FIG. 16C        FIG. 16D

SYSTEMS AND METHODS FOR CONTROLLING ETCH SELECTIVITY OF VARIOUS MATERIALS

CROSS-REFERENCE TO RELATED APPLICATIONS

This application claims the benefit of U.S. Patent Application Ser. No. 61/503,271, filed on Jun. 30, 2011. The disclosure of this application is hereby incorporated by reference in its entirety.

FIELD

The present disclosure relates to substrate processing systems, and more particularly to substrate processing systems for controlling etch selectivity of various materials.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Deposition of tungsten-containing film using chemical vapor deposition (CVD) is an integral part of many semiconductor fabrication processes. Tungsten-containing film may be used for horizontal interconnects, vias between adjacent metal layers, contacts between a first metal layer and the devices on the silicon substrate, and high aspect ratio features. During deposition, a substrate is heated to a process temperature in a deposition chamber. A liner/barrier layer made of titanium or titanium nitride (TiN) is deposited. Thereafter, the tungsten-containing film (the bulk layer) is deposited on the liner/barrier layer.

Depositing tungsten-containing film into high aspect ratio features may cause formation of seams inside the features. The seams may lead to high resistance, contamination and loss of filled materials. In other words, the seams degrade performance of integrated circuits. For example, a seam may extend close to a field region after the filling process and then open during chemical-mechanical planarization.

Referring now to FIGS. 1A-1D, an example of a process according to the prior art for filling a recessed feature with tungsten-containing film is shown. In FIG. 1A, a substrate 100 includes a recessed feature 104 such as a contact or via hole to be filled with W. In FIG. 1B, a liner/barrier layer 108 is deposited. The liner/barrier layer 108 may be made of titanium (Ti) or titanium nitride (TiN). The liner/barrier layer 108 typically creates an overhang 110 or pinch point near an opening of the recessed feature 104. A tungsten-containing film 112 is then deposited over the liner/barrier layer 108 using CVD deposition.

Filling features with tungsten-containing film may cause formation of seams inside the filled features. A seam can form when a layer that is being deposited on the side walls of the feature thickens to the point that it seals off a void space below the sealing point (also referred to as a pinch point). The pinch point prevents precursors and/or other reactants from entering the void space, which remains unfilled. The void space or seam is also sometimes referred to as a keyhole. In FIG. 1C, a keyhole 114 remains after deposition. In FIG. 1O, chemical mechanical planarization (CMP) opens the keyhole 114.

In FIGS. 2A-2D, another example of a process according to the prior art for filling a recessed feature with a tungsten-containing film is shown. In FIG. 2A, a substrate 130 includes a recessed feature 134 such as a contact or via hole. A liner/barrier layer 138 is deposited. The liner/barrier may be made of Ti/TiN and may create an overhang 140. A W layer 142 is then deposited over the liner/barrier layer 138 using partial W CVD deposition. In FIG. 2B, an etch back step is performed with a fluorine species. Repeated deposition-etch cycles may be performed to reduce a keyhole 144 and seam in the W fill. In FIG. 2D, a CMP step may be used to open the keyhole 144.

The approach of FIGS. 2A-2D involves a partial fill in a first deposition step, which leaves the via open during a subsequent etch step. The subsequent etch step targeted at W removal in the field and overhang tends to have an unwanted side effect. The subsequent etch step also removes the W inside the via. A subsequent deposition step regrows W at the same rate inside the via and at the overhang, which results in the same keyhole void.

SUMMARY

This section provides a general summary of the disclosure, and is not a comprehensive disclosure of its full scope or all of its features.

A method for filling a recessed feature of a substrate includes a) at least partially filling a recessed feature of a substrate with tungsten-containing film using at least one of chemical vapor deposition (CVD) and atomic layer deposition (ALD); b) at a predetermined temperature, using an etchant including activated fluorine species to selectively etch the tungsten-containing film more than an underlying material of the recessed feature without removing all of the tungsten-containing film at a bottom of the recessed feature; and c) filling the recessed feature using at least one of CVD and ALD.

In other features, (a) includes filling the recessed feature with the tungsten-containing film such that an opening of the recessed feature is pinched off.

In other features, (a) includes filling the recessed feature with the tungsten-containing film such that an opening of the recessed feature is closed and overburden is deposited.

In other features, (b) is performed in one of a CVD chamber and an etch chamber.

In other features, the underlying material includes a liner/barrier layer. The liner/barrier layer includes one of titanium and tantalum. The material of the liner/barrier layer includes one of titanium, titanium nitride, tantalum nitride, and TiCxNx. The method includes repeating (a) and (b) one or more times before (c).

In other features, the method includes performing chemical mechanical planarization (CMP) of the substrate after (c).

In other features, the predetermined temperature is less than or equal to 150° C. The predetermined temperature is less than or equal to 100° C. The predetermined temperature is less than or equal to 50° C. The liner/barrier layer includes an overhang that creates a pinch point at an opening of the recessed feature.

In other features, the method includes adding one or more of nitrogen, oxygen, hydrogen, helium, argon, or fluorine to slow etching of the liner/barrier layer.

In other features, the method includes oxidizing the liner/barrier layer prior to (a).

An apparatus for depositing a film on a substrate includes one or more chambers and a source that provides activated fluorine species. A controller initiates in the one or more chambers: a) partially filling a recessed feature of a substrate with tungsten-containing film using at least one of chemical vapor deposition (CVD) and atomic layer deposition (ALD); b) at a predetermined temperature, using an etchant including the activated fluorine species to selectively etch the tungsten-containing film more than an underlying material of the recessed feature without removing all of the tungsten-containing film at a bottom of the recessed feature; and c) filling the feature using at least one of CVD and ALD.

In other features, (a) includes filling the recessed feature with the tungsten-containing film such that an opening of the recessed feature is pinched off.

In other features, (a) includes filling the recessed feature with the tungsten-containing film such that an opening of the recessed feature is closed and overburden is deposited.

In other features, (b) is performed in one of a CVD chamber and an etch chamber.

In other features, the underlying material includes a liner/barrier layer. The liner/barrier layer includes one of titanium and tantalum. The liner/barrier layer includes one of titanium, titanium nitride, tantalum nitride, and TiCxNx.

In other features, the controller repeats (a) and (b) one or more times before (c). In other features, chemical mechanical planarization (CMP) of the substrate is performed after (c). The predetermined temperature is less than or equal to 150° C. The predetermined temperature is less than or equal to 100° C. The predetermined temperature is less than or equal to 50° C.

In other features, the liner/barrier layer includes an overhang that creates a pinch point at an opening of the recessed feature. The controller initiates adding one or more of nitrogen, oxygen, hydrogen, helium, argon, or fluorine to slow etching of the liner/barrier layer. The controller initiates oxidizing the liner/barrier layer prior to (a).

A method for creating a film on a substrate includes a) depositing a tungsten-containing layer using at least one of chemical vapor deposition (CVD) and atomic layer deposition (ALD) on an underlying layer, wherein the underlying material is arranged on an oxide layer of a substrate; b) at a predetermined temperature, using activated fluorine species to selectively etch the tungsten-containing layer more than the underlying layer; and c) depositing a layer over the tungsten-containing layer using at least one of CVD or ALD.

In other features, the underlying layer includes a liner/barrier layer. The liner/barrier layer includes one of titanium and tantalum. The liner/barrier layer includes one of titanium, titanium nitride, tantalum nitride, and TiCxNx.

In other features, the predetermined temperature is less than or equal to 150° C. The predetermined temperature is less than or equal to 100° C. The predetermined temperature is less than or equal to 50° C.

In other features, the method includes adding one or more of nitrogen, oxygen, hydrogen, helium, argon, or fluorine gas to slow etching of the liner/barrier layer. The method includes oxidizing the underlying layer prior to (a). The layer comprises tungsten.

An apparatus for depositing a film on a substrate includes one or more chambers and a source that provides activated fluorine species. A controller initiates in the one or more chambers: a) depositing a tungsten-containing layer using at least one of chemical vapor deposition (CVD) or atomic layer deposition (ALD) on an underlying layer, wherein the underlying layer is arranged on an oxide layer of a substrate; b) at a predetermined temperature, using activated fluorine species to selectively etch the tungsten-containing layer more than the underlying material; and c) depositing a layer over the tungsten-containing layer.

In other features, the underlying material includes a liner/barrier layer. The liner/barrier layer includes one of titanium and tantalum. The liner/barrier layer includes one of titanium, titanium nitride, tantalum nitride, and TiCxNx.

In other features, the predetermined temperature is less than or equal to 150° C. The predetermined temperature is less than or equal to 100° C. The predetermined temperature is less than or equal to 50° C.

In other features, the controller initiates adding one or more of nitrogen, oxygen, hydrogen, helium, argon, or fluorine to slow etching of the liner/barrier layer. The controller initiates oxidizing the underlying layer prior to (a). The layer comprises tungsten.

A method for filling a recessed feature of a substrate includes a) filling a recessed feature of a substrate with tungsten-containing film using conformal chemical vapor deposition (CVD); b) at a first predetermined temperature, using activated fluorine species to selectively etch the tungsten-containing film more than an underlying material of the liner barrier layer; and c) filling the feature using selective CVD.

In other features, the method includes d) at a second predetermined temperature, using activated fluorine species to selectively etch the t-containing film more than the underlying material of the liner barrier layer.

In other features, the method includes repeating (c) and (d) one or more times.

In other features, the method includes performing chemical mechanical planarization (CMP) of the substrate after (d).

A method for filling a recessed feature of a substrate includes a) filling the recessed feature of a substrate with tungsten-containing film), wherein the recessed feature includes an underling material and includes an overhang that creates a pinch point at an opening of the recessed feature, and wherein a void is created in the tungsten-containing film; b) at a predetermined temperature, using activated fluorine radicals to selectively etch the tungsten-containing film more than the underlying material and to open the void in the tungsten-containing film; c) partially filling the recessed feature using selective CVD, wherein the selective CVD deposits more material at a bottom of the recessed feature than on sides or a field of the recessed feature; and d) filling a remainder of the feature using CVD.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The present disclosure will become more fully understood from the detailed description and the accompanying drawings, wherein:

FIGS. 16A-16D illustrate another example of a fill process according to the present disclosure;

DETAILED DESCRIPTION

Figure 1:
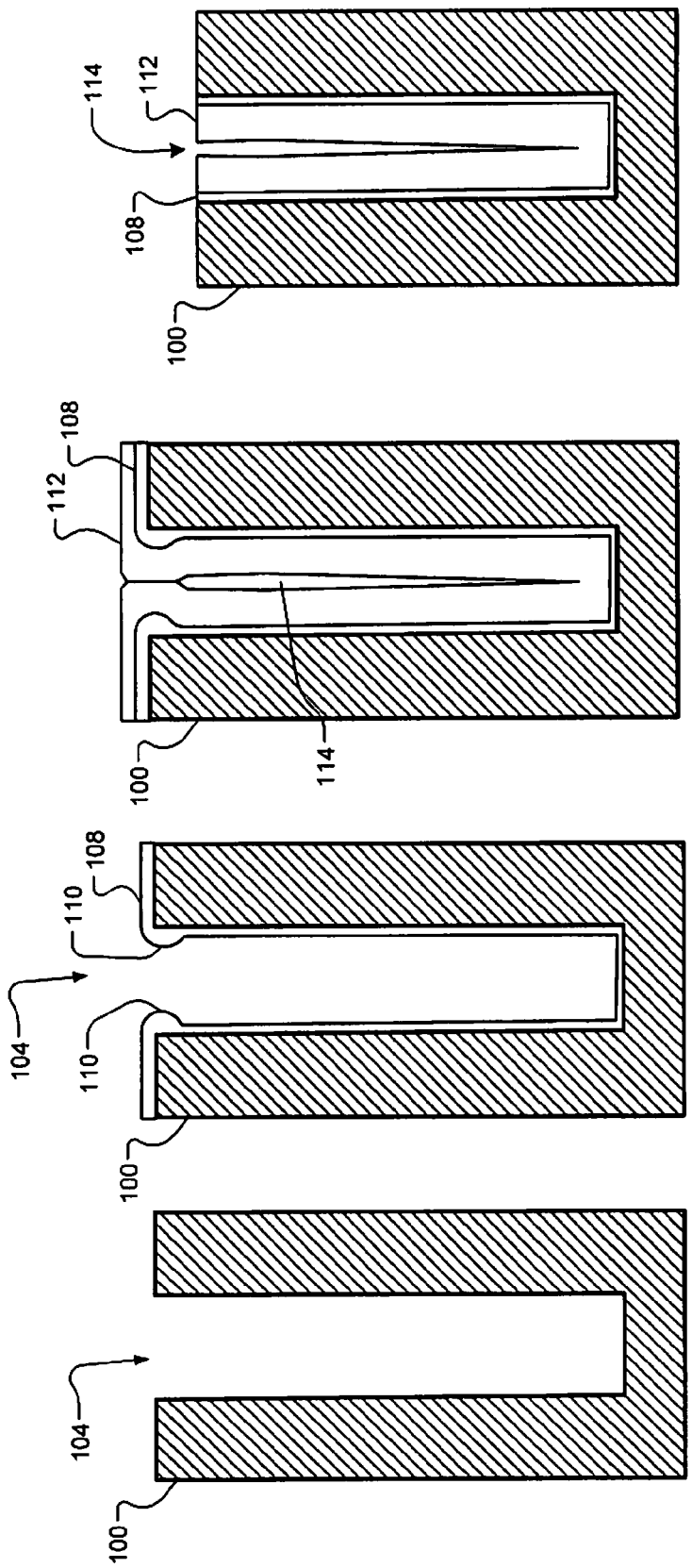
FIG. 1 illustrates an example of a process for chemical vapor deposition (CVD) W fill according to the prior art.
Figure 2:
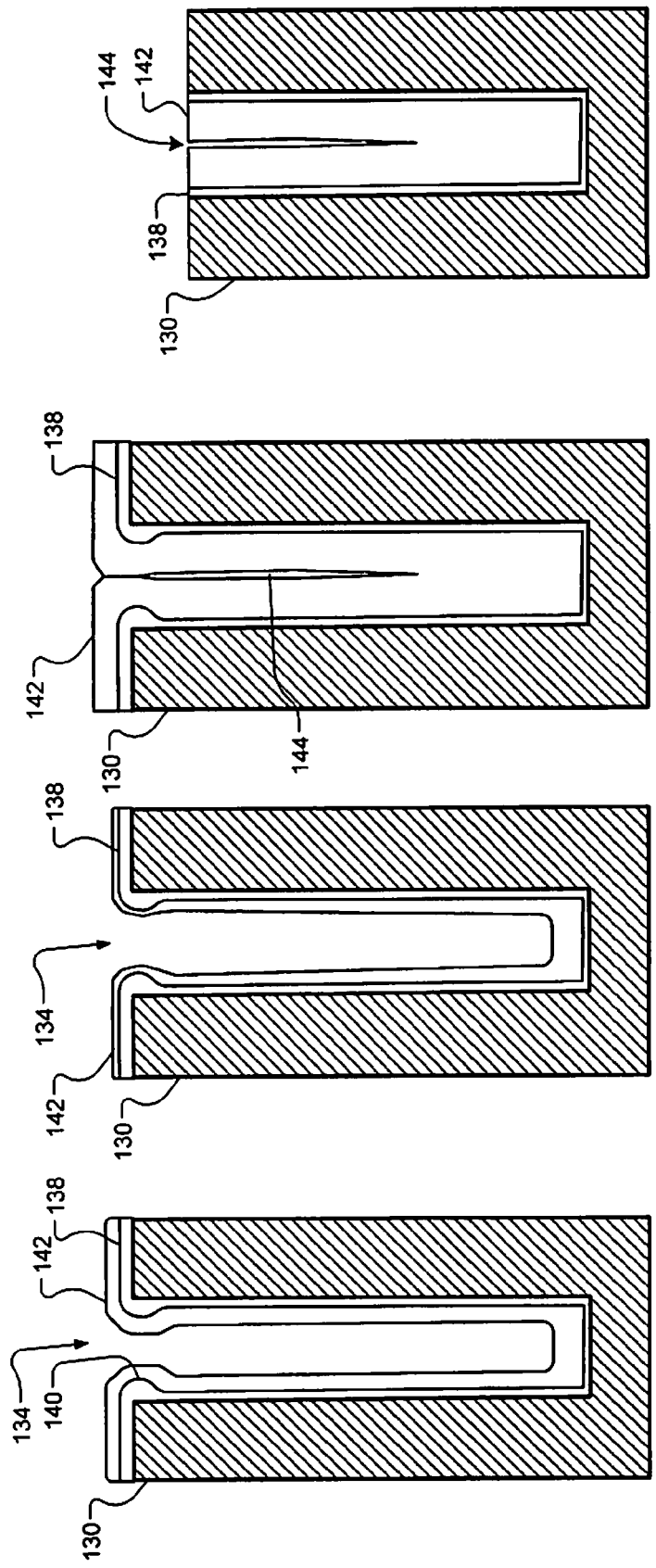
FIG. 2 illustrates another example of process for chemical vapor deposition (CVD) W fill according to the prior art.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure. As used herein, deposition and etching of tungsten refers to deposition and etching of tungsten or tungsten-containing film.

The present disclosure relates to systems and methods for filling features and/or fabricating substrates such as semiconductor substrates using a process that includes selective tungsten/titanium nitride (W/TiN) etching. As used herein, the term selective W etch refers to an etch step that uses a fluorine based etchant and that has an etch ratio (W/Ti, W/TiN) that can be adjusted using temperature. More particularly, selective W etching of Ti/TiN is based on the difference in apparent activation energies for fluorine (F)-radical etch of W and TiN. At high temperatures (e.g., T>150° C.), the W/TiN etch rate ratio is <1. At low temperatures (e.g., T<150° C.), the W/TiN etch rate ratio is >1. At temperatures T<50° C., the W/TiN etch rate ratio is >100:1. Therefore, the systems and methods according to the present disclosure are capable of providing etch selectivity that ranges from <0.5:1 to >100:1.

The high etch selectivity enables new integration schemes as well as process control using Ti or TiN as an etch stop. Temperature may be controlled using a temperature controlled pedestal or any other suitable method. Additionally, pressure may be adjusted to alter etch selectivity. Systems and methods for etching according to the present disclosure are based on a fluorine radical etch step to shape tungsten-containing film deposited in re-entrant features to enable seam free fill by a subsequent chemical vapor deposition (CVD) W. In some examples, the fluorine radicals may be generated from $NF_3$/Ar or $NF_3$/He plasma in a remote plasma source or using other approaches. In some examples, the deposition and etching are performed in a plasma-enhanced chemical vapor deposition system, although other systems may be used. While fluorine radicals are disclosed, any other type of activated fluorine species can be used. For example only, thermally activated fluorine gas may also be used to create activated fluorine species. Ultraviolet or microwave activated fluorine may also be used.

While the foregoing examples describe deposition and etch steps in a CVD chamber, other devices may be used. For example, ALD deposition of tungsten-containing film may also be performed in an ALD chamber. Etching may be performed in a separate etch chamber.

Figure 3:
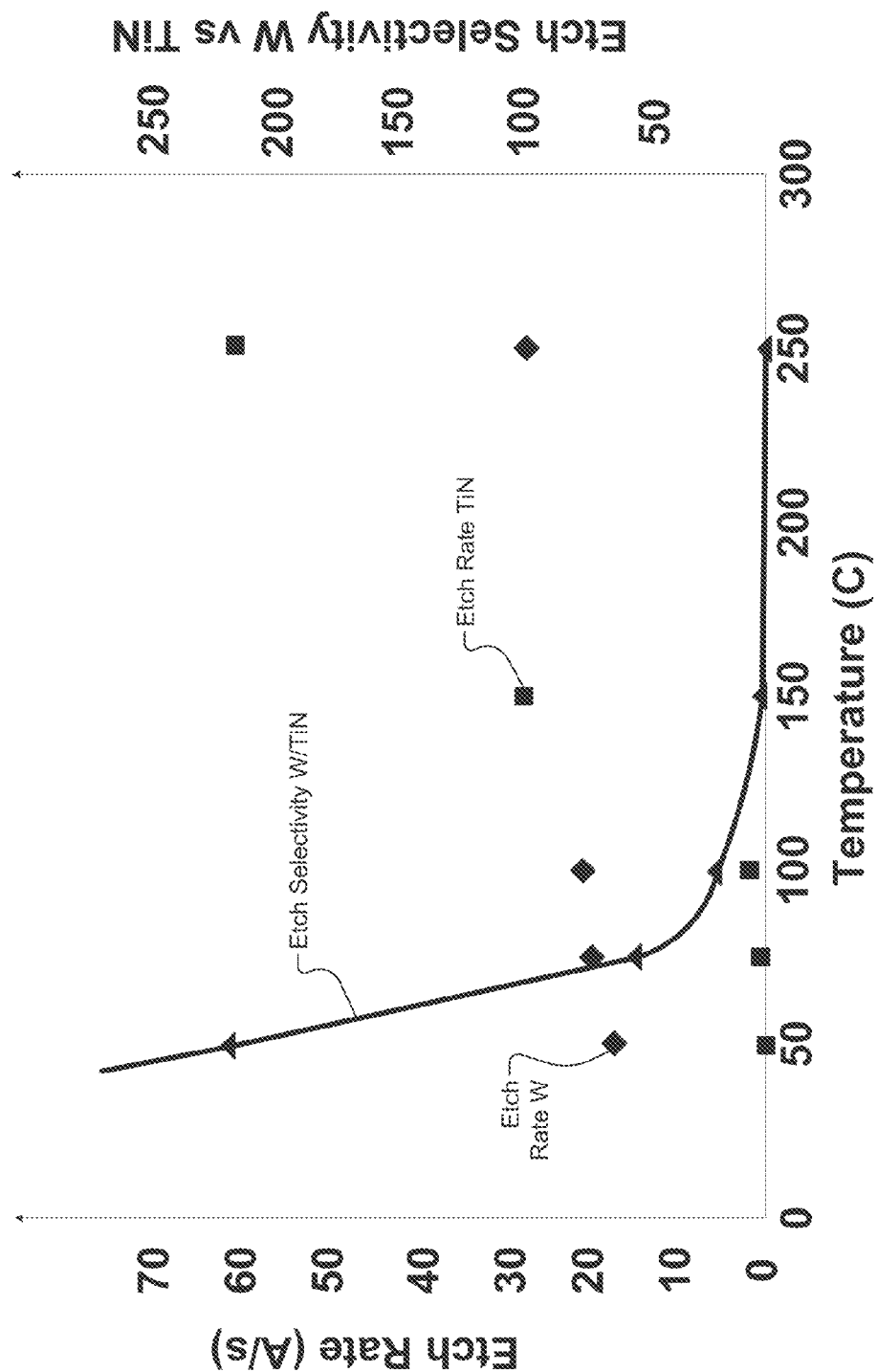
FIG. 3 is a graph showing etch rates for W and TiN and etch rate sensitivity as a function of temperature (T) according to the present disclosure.
Figure 4:
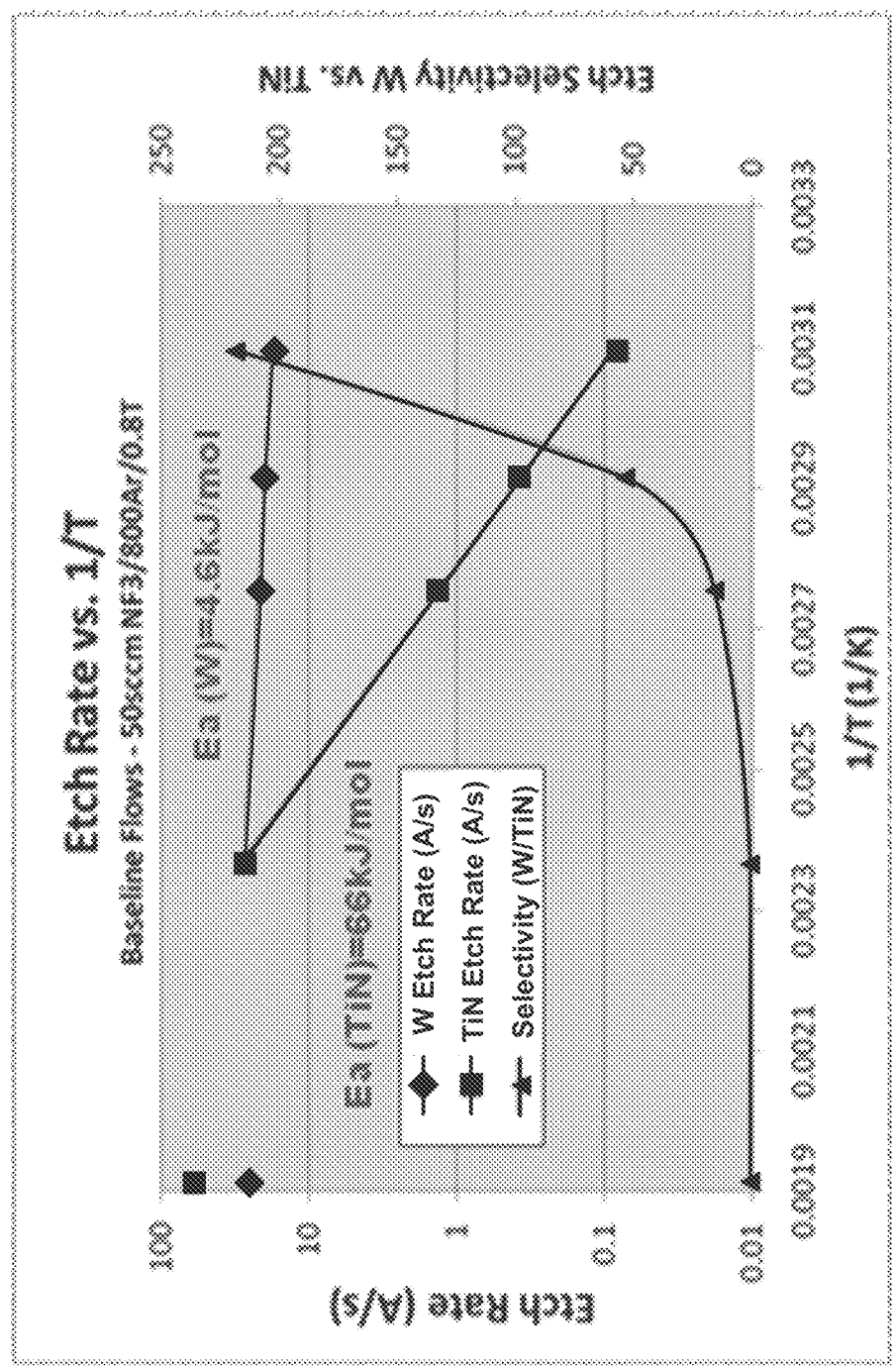
FIG. 4 is a graph showing etch rates for W and TiN and etch rate sensitivity as a function of 1/T according to the present disclosure.

Referring now to FIGS. 3 and 4, etch selectivity is shown to vary as a function of temperature. As can be seen, low temperatures provide higher W/TiN etch selectivity. In FIG. 3, the temperature dependency of etch rates for W and TiN and etch selectivity of W/TiN are shown. In FIG. 4, etch rate and etch rate selectivity are shown as a function of 1/T for a given etchant flow.

Figure 5:
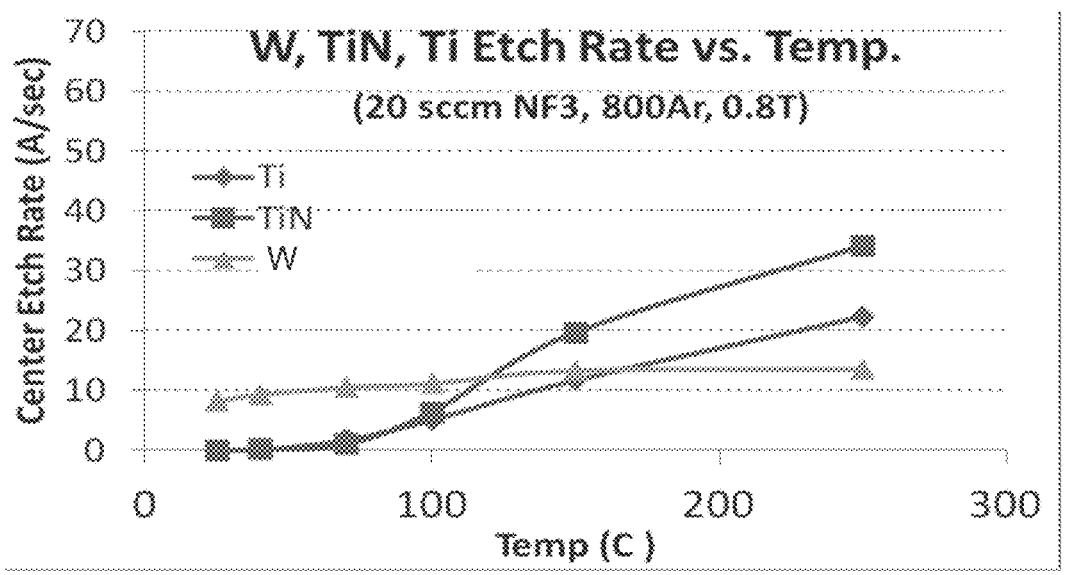
FIGS. 5 and 6 are graphs illustrating etch rate for Ti and TiN and selectivity for W/Ti and W/TiN as a function of temperature for a first flow rate according to the present disclosure.
Figure 6:
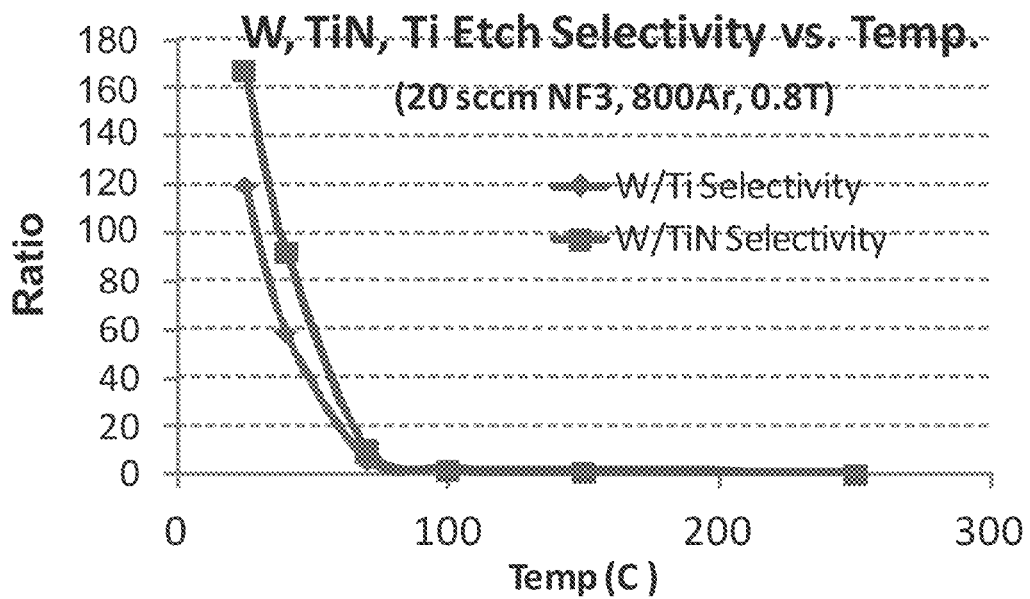
Figure 7:
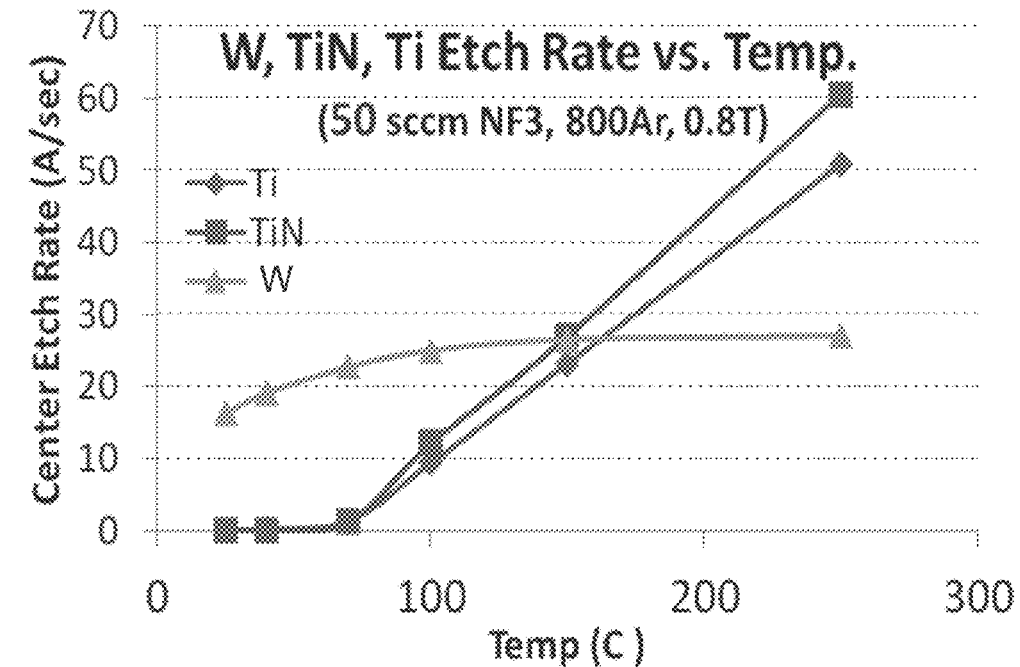
FIGS. 7 and 8 are graphs illustrating etch rate for Ti and TiN and selectivity for W/Ti and W/TiN as a function of temperature for a second flow rate according to the present disclosure.
Figure 8:
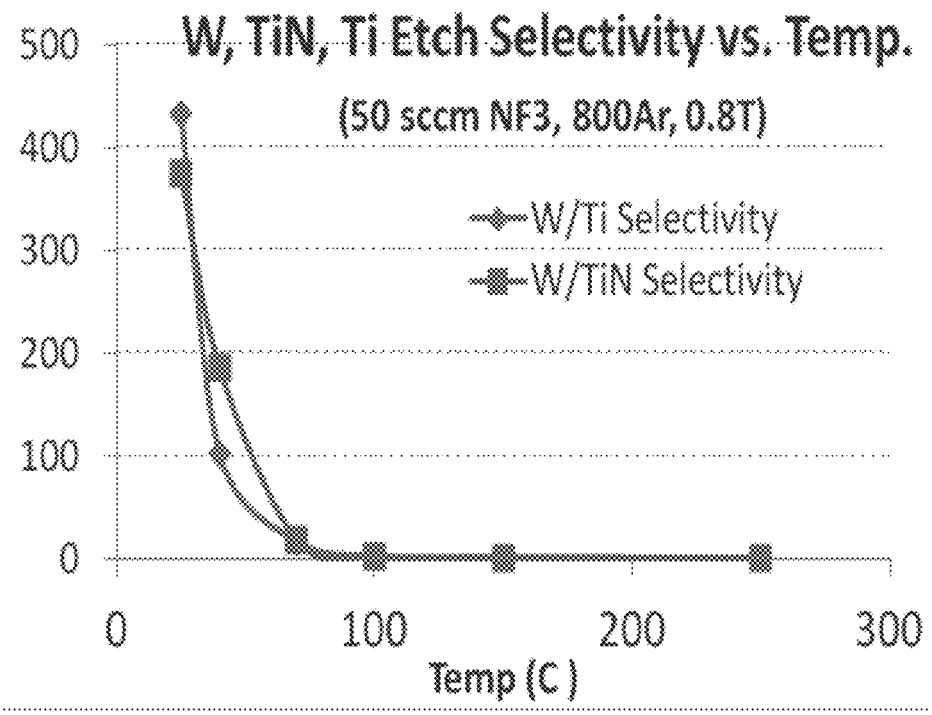

Referring now to FIGS. 5-8, etch rates and etch rate selectivity for W/Ti and W/TiN are shown. In FIGS. 5 and 7, graphs illustrating etch rates for Ti and TiN are shown as a function of temperature for first and second etchant flow rates. In FIGS. 6 and 8, graphs illustrating etch rate selectivity for W/Ti and W/TiN are shown as a function of temperature for the first and second flow rates.

The ability to selectively etch W enables enhanced plug fill of reentrant features by providing the ability to over-etch the top of the features. This could also allow for improved process margin and the ability to optimize fill for a range of feature sizes since the etch thickness does not need to be controlled as precisely.

Figure 9:
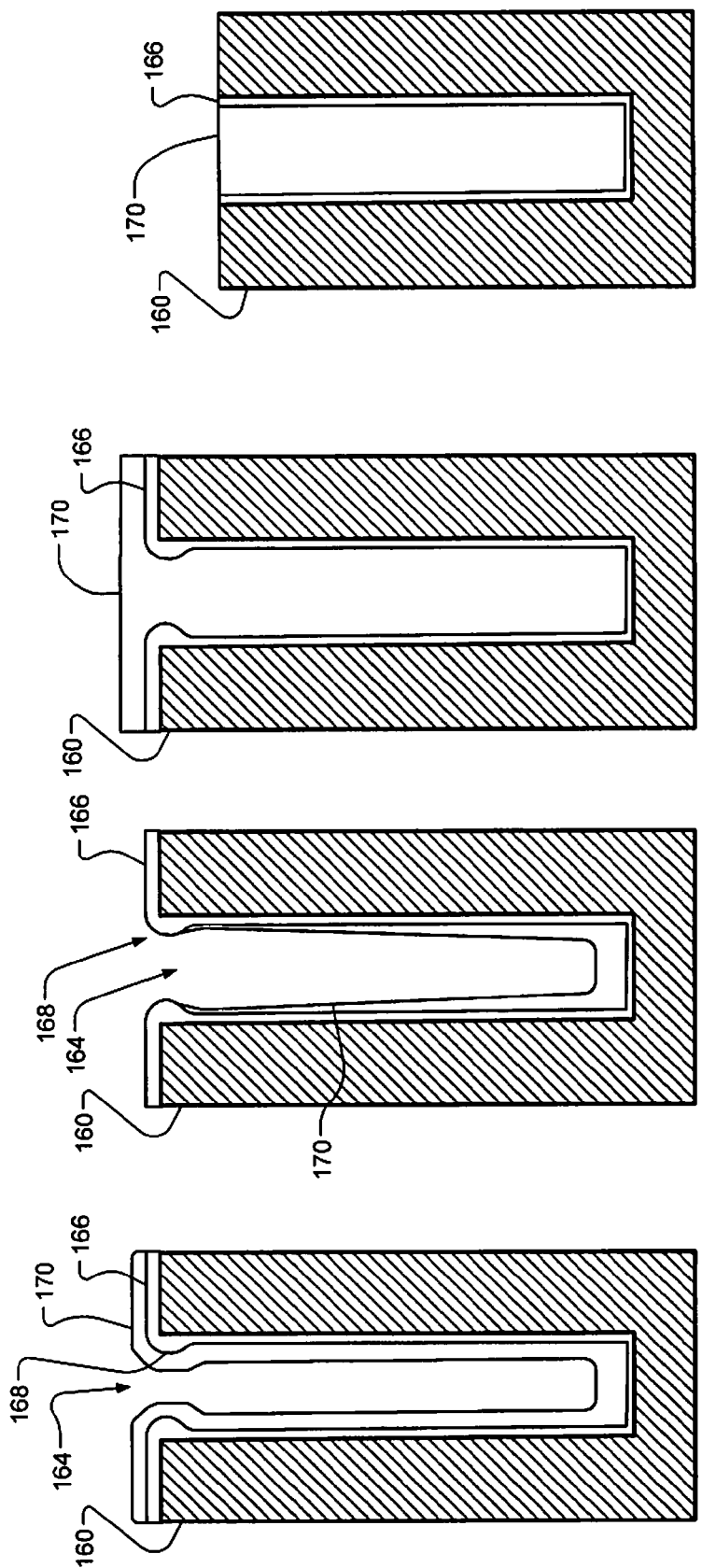
FIGS. 9A-9D illustrate an example of a fill process according to the present disclosure.

Referring now to FIGS. 9A-9D, a process for filling a recessed feature with tungsten-containing film according to the present disclosure is shown. The process includes using partial CVD fill, fluorine-based etch with selective W etch, CVD W deposition and W CMP. In FIG. 9A, a substrate 160 includes a recessed feature 164 such as a contact or via hole. A liner/barrier layer 166 such as Ti or TiN is deposited and creates an overhang 168.

A tungsten-containing film 170 is then deposited over the liner/barrier layer 166 using partial W CVD deposition. In FIGS. 9B and 9C, a selective W etch back step is performed with fluorine species as described above. In some examples, the temperature of the selective W etch is less than or equal to 150° C. In other examples, the temperature of the selective W etch is less than or equal to 100° C. In other examples, the temperature of the selective W etch is less than or equal to 50° C.

As can be appreciated, portions of the tungsten-containing film 170 that were previously deposited on an upper surface and near the overhang 168 are etched to the liner/barrier layer 166. Deposition of W and selective W etching steps may be repeated one or more times if desired. In FIG. 9D, CMP may be performed. As can be seen, the keyhole is substantially reduced or eliminated as compared to that shown in FIGS. 1A-2D.

Figure 10:
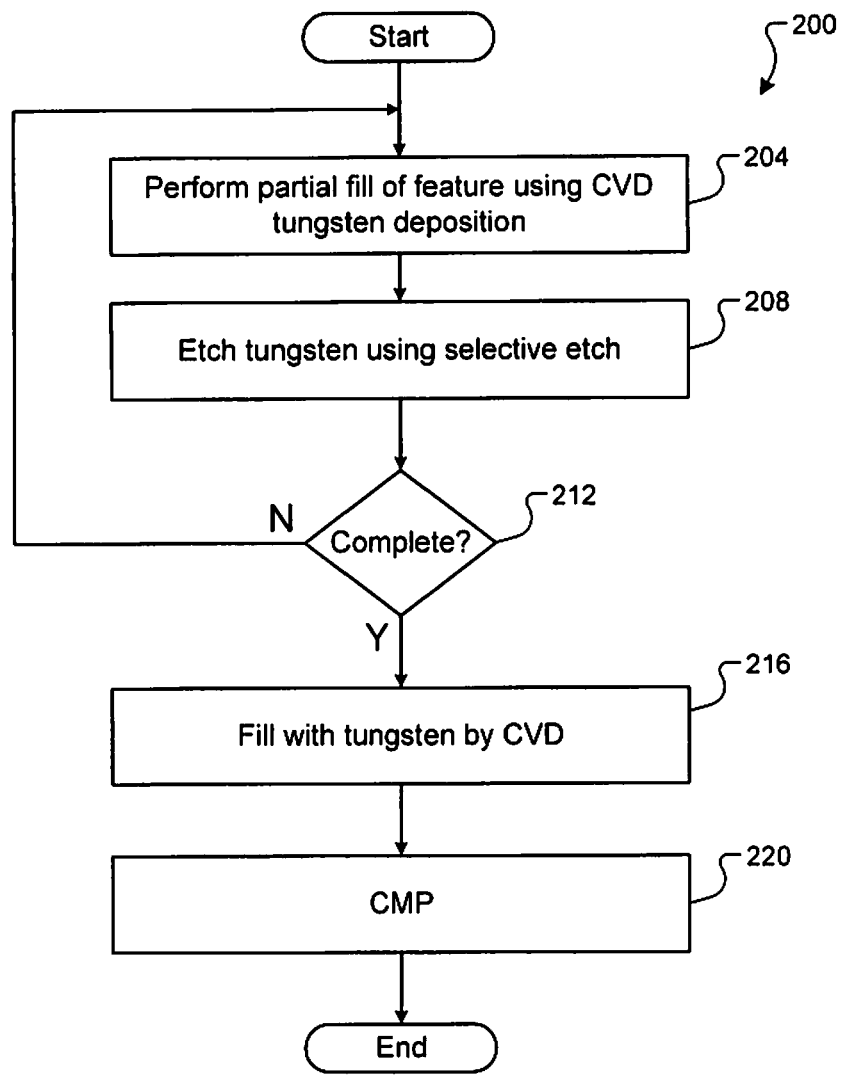
FIG. 10 is a flowchart illustrating steps of the process used in FIGS. 9A-9D according to the present disclosure.

Referring now to FIG. 10, a flowchart illustrating steps of a process 200 used in FIGS. 9A-9D is shown. At 204, partial W fill of a recessed feature is performed using CVD W deposition. At 208, selective W etching of the W is performed. The selective W etch back step is performed with fluorine species as described above. In some examples, the temperature of the selective W etch is less than or equal to 150° C. In other examples, the temperature of the selective W etch is less than or equal to 100° C. In other examples, the temperature of the selective W etch is less than or equal to 50° C. At 212, if the feature is not filled in one step, control may return one or more times to step 204 to perform partial deposition of W and to step 208 for selective W etching of the W at 208. At 216, the feature is filled using CVD deposition of W. At 220, CMP is performed.

Figure 11:
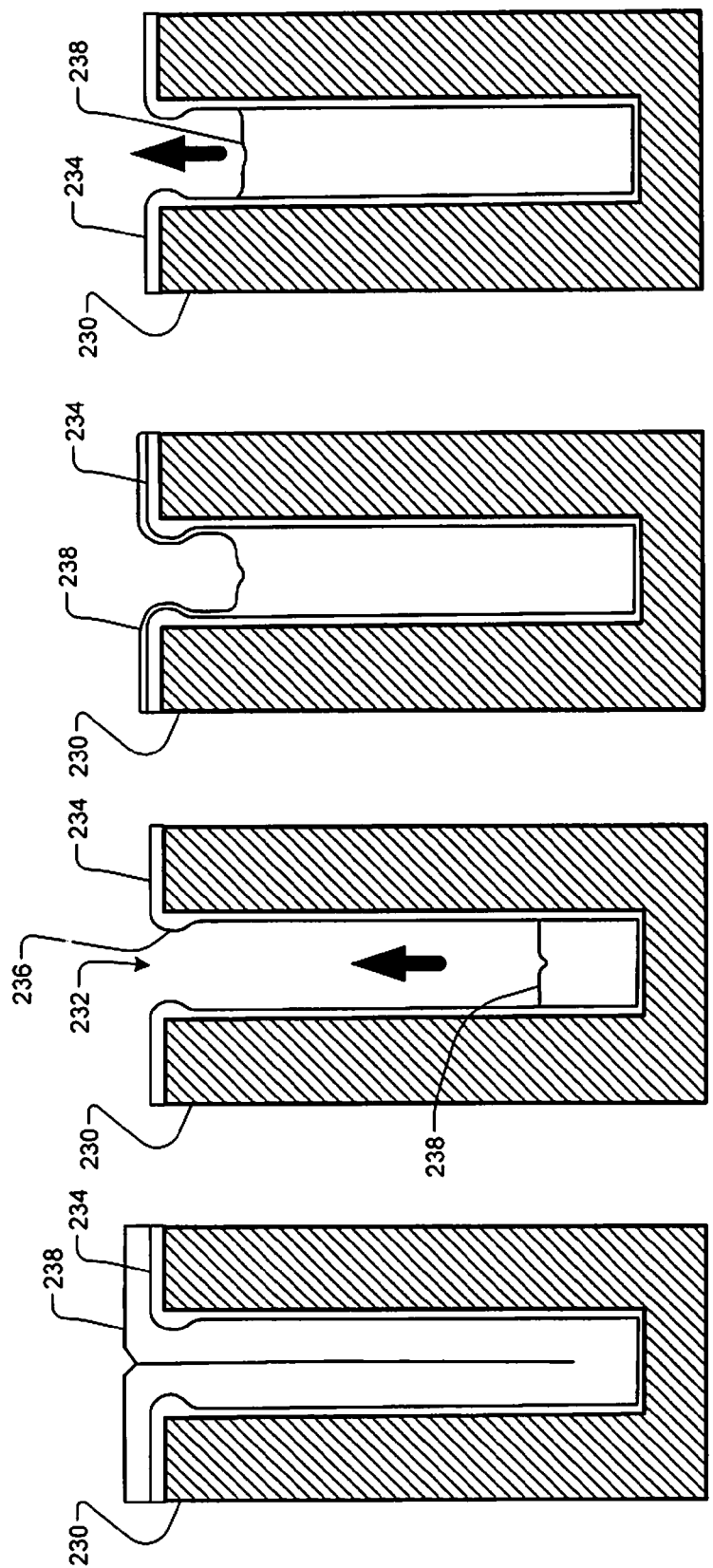
FIGS. 11A-11D illustrate another example of a fill process according to the present disclosure.

Referring now to FIGS. 11A-11D, a W fill process using one or more selective W etch and selective W deposition steps is shown. Selective W etch can enable "bottom up" W fill of a recessed feature such as a trench or via using selective W etch and selective deposition. In FIG. 11A, a substrate 230 includes a recessed feature 232 such as a contact or via hole. A liner/barrier layer 234 such as Ti/TiN is deposited and creates an overhang 236. A W layer 238 is then deposited over the liner/barrier layer using conformal CVD W fill.

For example only, conformal CVD deposition of tungsten-containing film is described in U.S. Pat. No. 6,635,965 entitled "Method for Producing Ultra-thin tungsten Layers with Improved Step Coverage", which issued on Oct. 21, 2003, U.S. Pat. No. 7,141,494 entitled "Method for Reducing tungsten Film Roughness and Improving Step Coverage", which issued on Nov. 28, 2006, U.S. Patent Application Publication No. 20080254623 entitled "Method for Growing Low Resistivity tungsten for High Aspect Ratio and Small Features", and U.S. patent application Ser. No. 12/755,248 entitled "Method for Depositing Ultrathin Low Resistivity tungsten Film for Small Critical Dimension Contacts and Interconnects", which are all hereby incorporated by reference in their entirety. These references describe one or more suitable conformal CVD deposition processes, although other conformal CVD deposition systems and processes may be used.

In FIG. 11B, a selective W etch step is performed. The selective W etch back step is performed with fluorine species as described above. In some examples, the temperature of the selective W etch is less than or equal to 150° C. In other examples, the temperature of the selective W etch is less than or equal to 100° C. In other examples, the temperature of the selective W etch is less than or equal to 50° C. In FIG. 11C, selective CVD W fill (for example only, >50 nm) is performed. As used herein, selective CVD W fill deposits more W at a bottom of the feature than on sides or a field region of the feature.

For example only, selective CVD fill is described in Patent Publication No. 20110059608 entitled "Systems and Methods for Selective tungsten Deposition in Vias", U.S. Pat. No. 8,119,527 entitled "Depositing tungsten into High Aspect Ratio Features", which issued on Feb. 21, 2012, U.S. Pat. No. 8,124,531 entitled "Depositing tungsten into High Aspect Ratio Features", which issued on Feb. 21, 2012, and U.S. Patent Publication No. 20120115329 entitled "Depositing tungsten into High Aspect Ratio Features", which are all hereby incorporated by reference in their entirety. While these references describe suitable selective CVD fill processes, other selective CVD fill systems and processes may be used.

In FIG. 11D, a selective W etch is performed. Selective CVD W fill and selective W etch can be repeated as needed. A CMP step may be performed.

Figure 12:
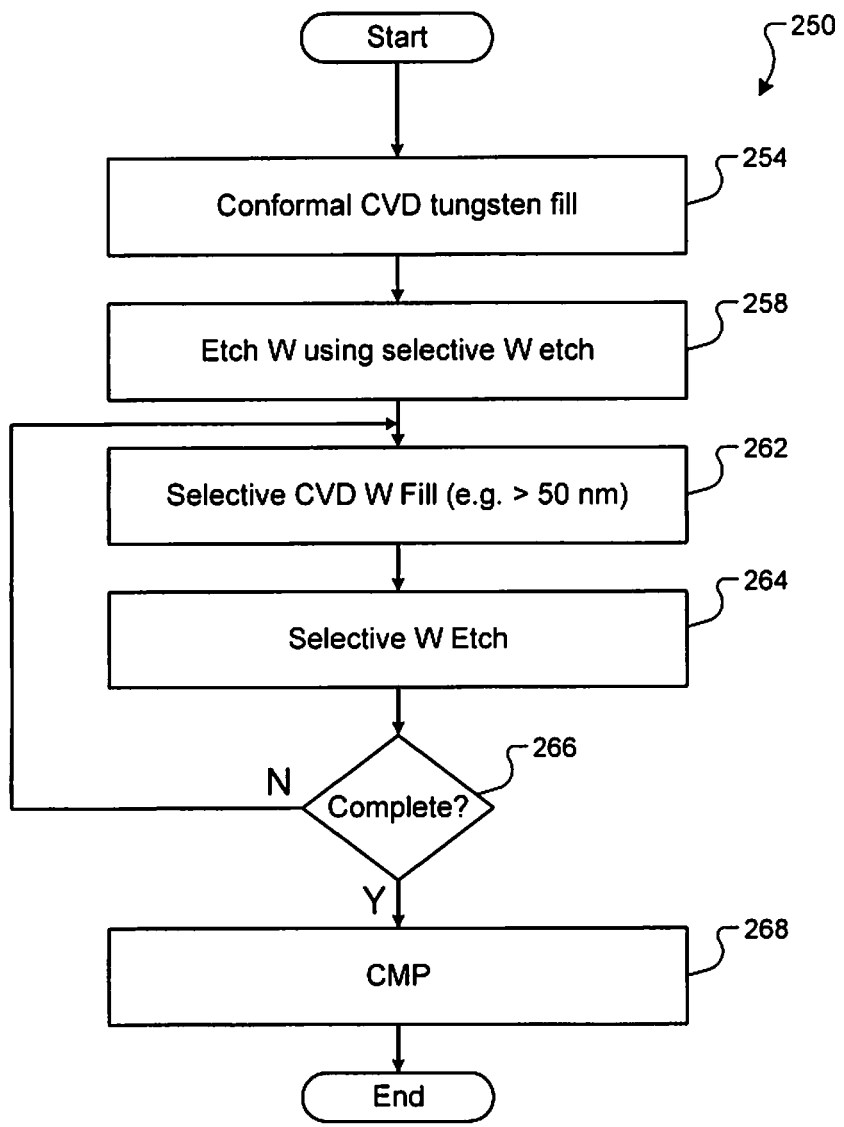
FIG. 12 is a flowchart illustrating steps of the process used in FIGS. 11A-11D according to the present disclosure.

Referring now to FIG. 12, steps of a process 250 used in FIGS. 11A-11D are shown. At 254, a recessed feature is filled using conformal CVD W. At 258, a selective W etch step is performed. At 262, selective CVD fill is performed. In some examples, greater than 50 nm is deposited. At 264, selective W etch is performed. At 266, if the process is not complete, additional selective CVD W fill and selective W etch are performed. At 268, a CMP step may be performed.

Figure 13A:
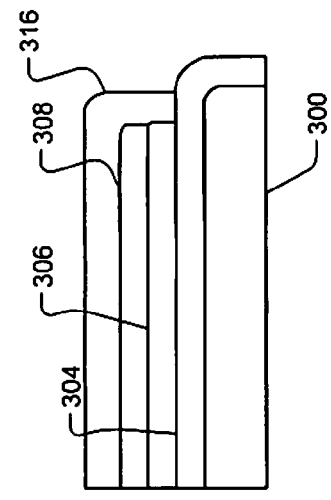
FIGS. 13A-13C illustrate a process for fabricating a film on a substrate according to the prior art.
Figure 13B:
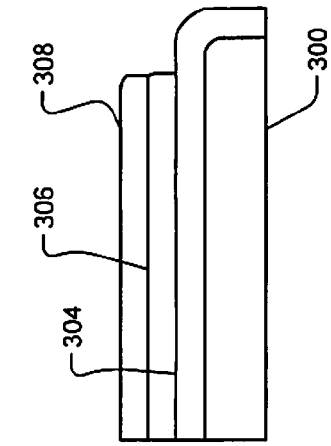
Figure 13C:
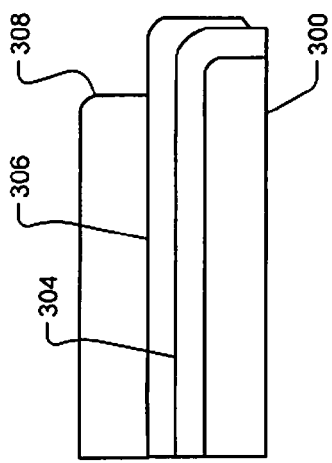

Referring now to FIGS. 13A-13C, a process for fabricating a film on a substrate according to the prior art is shown. In FIG. 13A, an oxide layer 304 is deposited on a substrate or underlying layer 300. A liner/barrier layer 306 made of Ti or TiN is deposited on the oxide layer 304. A W layer 308 is deposited on the liner/barrier layer 306. In FIG. 13B, an etching step is performed, which removes part of the W layer 308 and the exposed part of the liner/barrier layer 306. A W layer 316 (or another material) is deposited. However, delamination may occur where the W layer 316 (or other material) is deposited on the underlying oxide layer 304.

Figure 14A:
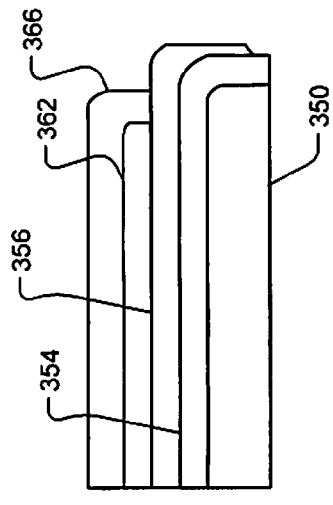
FIGS. 14A-14C illustrate an example of a process for fabricating a film on a substrate according to the present disclosure.
Figure 14B:
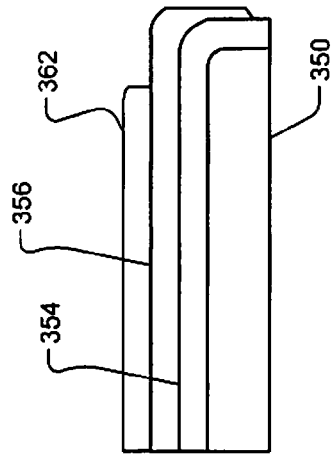
Figure 14C:
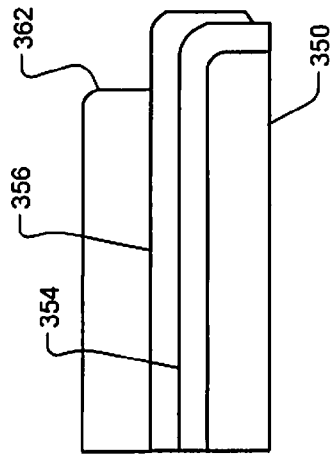

Referring now to FIGS. 14A-14C, a process for fabricating a film using selective W etch and having CVD W adhesion control at an edge of the substrate is shown. A selective W etch process is used to stop on Ti or TiN at an edge of a substrate such as a wafer to prevent film peeling during subsequent W deposition. The selective W etch back step is performed with fluorine species as described above. In some examples, the temperature of the selective W etch is less than or equal to 150° C. In other examples, the temperature of the selective W etch is less than or equal to 100° C. In other examples, the temperature of the selective W etch is less than or equal to 50° C.

An oxide layer 354 is deposited on a substrate or underlying layer identified at 350. A Ti or TiN layer 356 is deposited on the oxide layer 354. A W layer 362 is deposited on the TiN layer 356. A selective W etching step is performed, which removes part of the W layer 362 and but stops on the exposed part of the TiN layer 356.

A W layer (or another material) identified at 366 is deposited on the W layer 362. Good adhesion occurs between the W layer (or other material) 366 and underlying TiN layer and the problem of delamination is reduced or eliminated.

Figure 15:
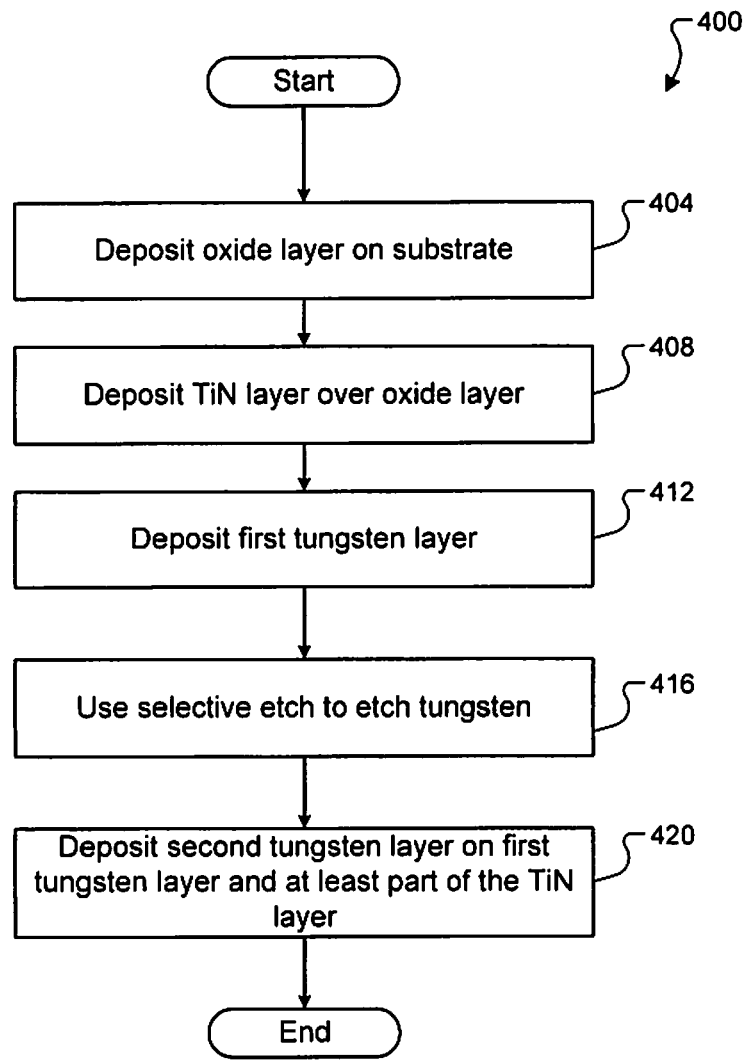
FIG. 15 is a flowchart illustrating steps of the process used in FIGS. 14A-14C.

Referring now to FIG. 15, steps of a process 400 used in FIGS. 14A-14C are shown. At 404, an oxide layer is deposited on a substrate. At 408, a Ti or TiN layer is deposited on the oxide layer. At 412, a first W layer is deposited. At 416, a selective W etch is performed to etch part of the first W layer. The selective W etch back step is performed with fluorine species as described above. In some examples, the temperature of the selective W etch is less than or equal to 150° C. In other examples, the temperature of the selective W etch is less than or equal to 100° C. In other examples, the temperature of the selective W etch is less than or equal to 50° C. At 420, a second W layer or another material is deposited on the first W layer and at least part of the Ti or TiN layer.

Referring now to FIGS. 16A-16D, another approach for filling a recessed feature with W is shown. In FIG. 16A, a substrate 450 defines a recessed feature 452 such as a via or contact hole having a pinch point or overhang 456. Conformal CVD W deposition is performed to fill the feature with W identified at 454. A void 458 is created in the W layer 454.

In FIG. 16B, selective W etching is used to open the void 458. The selective W etch back step is performed with fluorine species as described above. In some examples, the temperature of the selective W etch is less than or equal to 150° C. In other examples, the temperature of the selective W etch is less than or equal to 100° C. In other examples, the temperature of the selective W etch is less than or equal to 50° C.

In FIG. 16C, selective CVD W fill is used to fill the feature near the pinch point 456. In FIG. 16C, conformal CVD deposition is performed to fill the remainder of the feature.

In the proposed approach, the via is closed off until the end of the etch process, which keeps the W inside the via intact. At the same time, the W in the field and at the pinch point is overetched, which exposes the underlayer. A subsequent deposition step allows faster regrowth on the existing W in the via compared to slow W growth on the exposed underlayer in the pinch point and via. The selectively faster regrowth in the via allows for complete fill before the top pinches off.

Figure 17:
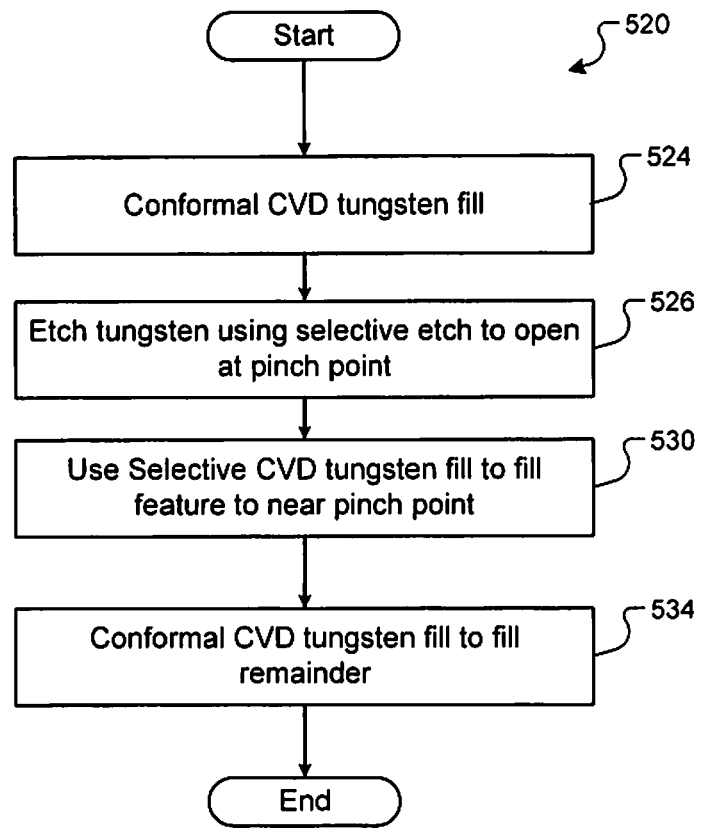
FIG. 17 is a flowchart illustrating steps of the process used in FIGS. 16A-16D.

Referring now to FIG. 17, a process 520 used in FIGS. 16A-16D is shown. At 524, conformal CVD deposition is performed to fill a feature of a substrate. At 526, selective W etching is used to open a void. At 530, selective CVD W fill is used to fill the feature near a pinch point. At 534, conformal CVD deposition is performed to fill the remainder of the feature. CMP may be performed.

In other features, a process gas may be added during selective W etching to inhibit Ti or TiN etching. For example, one or more of nitrogen, oxygen, hydrogen, helium, argon, or fluorine gas may be added to slow down Ti or TiN etch. For example, for oxygen and nitrogen, the following reactions occur:

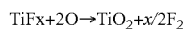

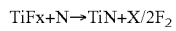

In other features, instead of Ti or TiN, the liner/barrier layer may be made of TiCxNx or TaN. In still other features, the liner/barrier layer can be oxidized prior to W deposition to create an effective etch stop.

The present disclosure provides new processing capabilities for W metallization, which can be used for many applications such as logic and memory contact fill, DRAM buried wordline fill, vertically integrated memory gate/wordline fill, 3D integration (TSV), etc.

Figure 18:
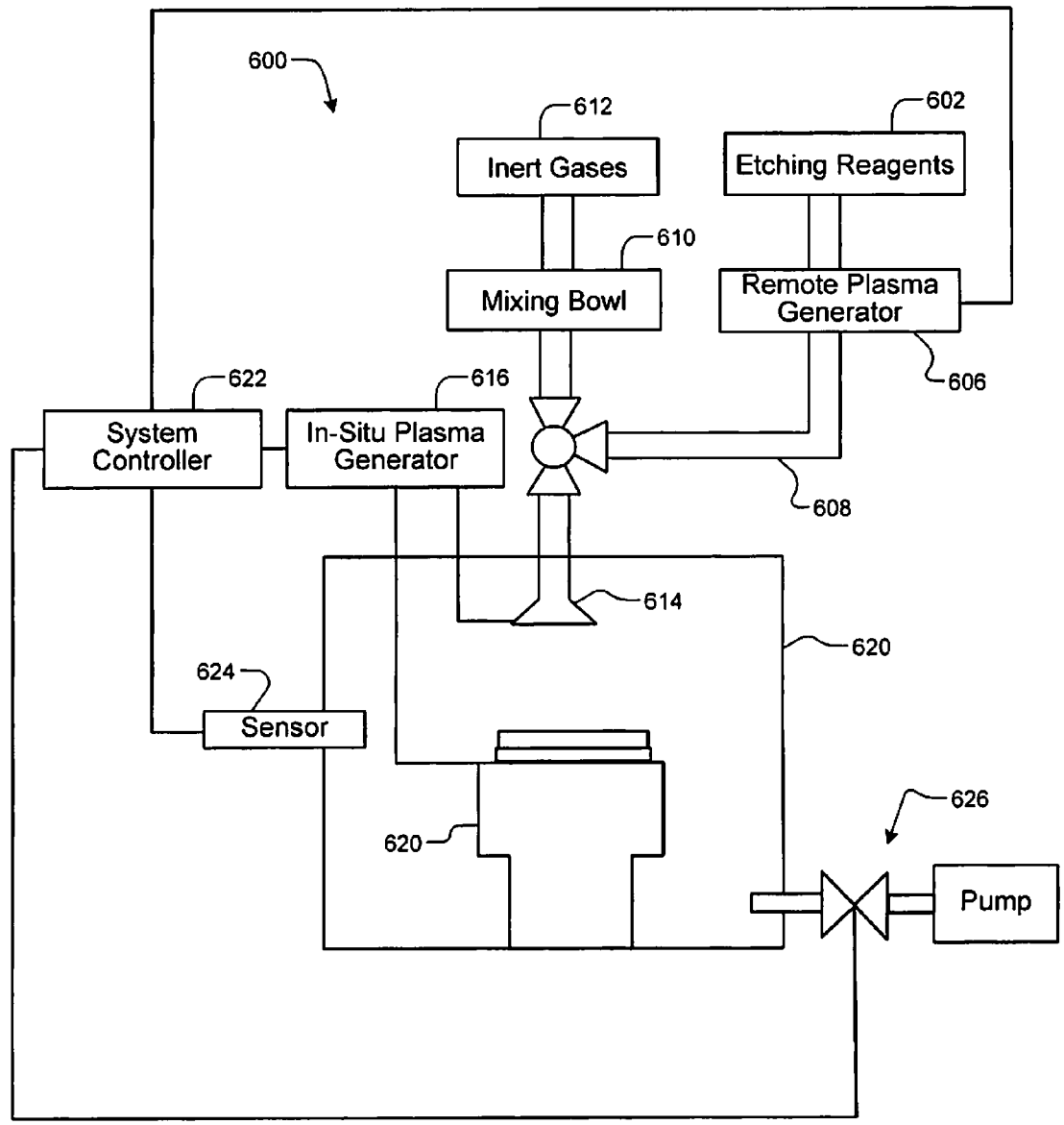
FIG. 18 illustrates an exemplary processing chamber.

Referring now to FIG. 18, an example of a substrate processing system 600 for processing a partially fabricated semiconductor substrate is shown. The substrate processing system 600 includes a chamber 618 with a pedestal 620, a shower head 614, and an in-situ plasma generator 616. The apparatus 600 also includes a system controller 622 to receive input and/or supply control signals to various devices. While a single chamber is shown, the processes described herein may be implemented in one or more processing chambers.

The etchant and, in certain embodiments, inert gases, such as argon, helium and others, are supplied to a remote plasma generator 606 from a source 602, which may be a storage tank. Any suitable remote plasma generator 606 may be used for activating the etchant before introducing it into the chamber 618.

The remote plasma generator 606 is typically a self-contained device generating weakly ionized plasma using the supplied etchant. Embedded into the remote plasma generator 606, a high power RF generator provides energy to the electrons in the plasma. The energy is then transferred to the neutral etchant molecules leading to high temperature causing thermal dissociation of these molecules. The remote plasma generator 606 may dissociate a high percentage of incoming etchant molecules due to high RF energy and special channel geometry causing the etchant to adsorb most of this energy.

In certain embodiments, etchant flows from the remote plasma generator 606 through a connecting line 608 into the chamber 618, where the mixture is distributed through the shower head 614. In other embodiments, etchant flows into the chamber 618 directly completely bypassing the remote plasma generator 606 (e.g., the system 600 does not include such generator). Alternatively, the remote plasma generator 606 may be turned off while flowing the etchant into the chamber 618, for example, because activation of the etchant is not needed.

A plasma generator 616 may be used. In one example, the generator 616 is a High Frequency (HF) generator capable of providing between about 0 W and 10,000 W at frequencies between about 1 MHz and 100 MHz. In a more specific examples, the HF generator may deliver between about 0 W to 5,000 W at about 13.56 MHz. The RF generator 616 may generate in-situ plasma to enhance removal of the initial tungsten layer. In certain embodiments, the RF generator 616 is not used during the removal operations of the process.

The chamber 618 may include one or more sensors 624 for sensing various process parameters, such as degree of deposition and etching, concentrations, pressure, temperature, and others. The sensors 624 may provide information on chamber conditions during the process to the system controller 622. Examples of the sensors 2 624 include mass flow controllers, pressure sensors, thermocouples, and others. The sensor 624 may also include an infra-red detector or optical detector to monitor presence of gases in the chamber and control measures.

Deposition and selective removal operations generate various volatile species that are evacuated from the chamber 618. Moreover, processing is performed at certain predetermined pressure levels the chamber 618. Both of these functions are achieved using a vacuum outlet 626, which may be a vacuum pump.

The system controller 622 executes system control software including sets of instructions for controlling the timing, mixture of gases, chamber pressure, chamber temperature, and other parameters of a particular process. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, etchant flow rates, etc. These parameters are provided to the user in the form of a recipe, and may be entered utilizing the user interface. Signals for monitoring the process may be provided by analog and/or digital input connections of the system controller 622. The signals for controlling the process are output on the analog and digital output connections of the apparatus 600.

Figure 19:
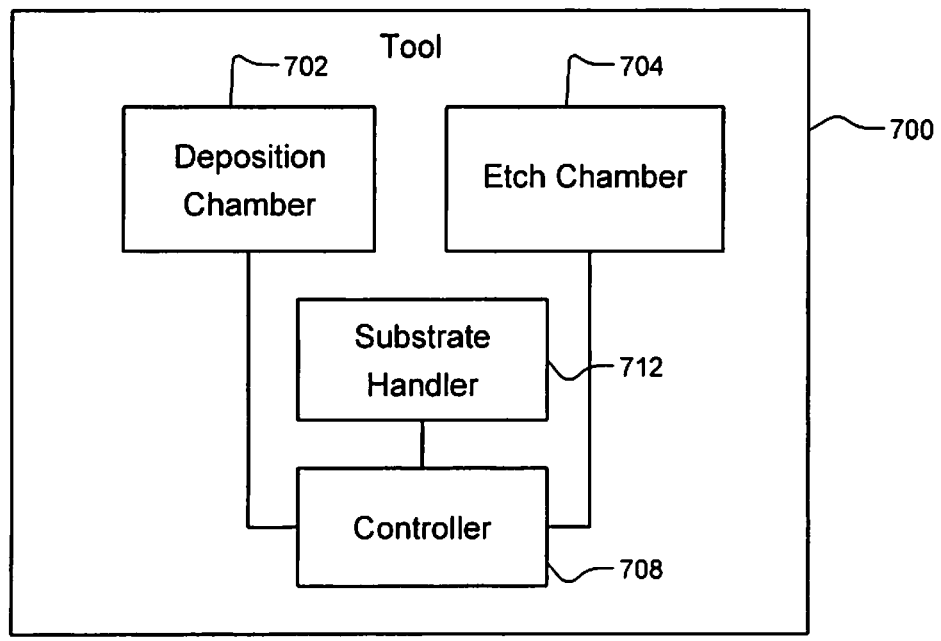
FIG. 19 illustrates an example of a substrate processing tool including a deposition chamber and an etch chamber.

Referring now to FIG. 19, an example of a substrate processing tool 700 including a deposition chamber 702 and an etch chamber 704 is shown. Deposition of the tungsten-containing film may be performed in the deposition chamber 702. A controller 708 may be used to control operation of the deposition chamber 702 and/or the etch chamber 704. The controller 708 may initiate transfer of a substrate to/from the etch chamber 704 and/or the deposition chamber 702 using a substrate handler 712. While the deposition chamber 702 and the etch chamber 704 are shown as part of the same tool 700, the deposition chamber 702 and the etch chamber 704 may be associated with different tools.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A method for filling a recessed feature of a substrate, comprising:
   a) providing a substrate including a dielectric layer, a liner/barrier layer, and a recessed feature;
   b) at least partially filling the recessed feature of the substrate with tungsten-containing film using at least one of chemical vapor deposition (CVD) and atomic layer deposition (ALD);
   c) at a predetermined temperature less than or equal to 150° C., using an etchant including activated fluorine species to selectively etch the tungsten-containing film in the recessed feature at an etch rate that is higher than an etch rate of the liner/barrier layer, wherein the etching exposes at least a portion of the liner/barrier layer in the recessed feature and does not remove all of the tungsten-containing film at a bottom of the recessed feature;
   d) repeating (b) and (c) one or more times, wherein, during a first iteration of (c), the etching removes the tungsten-containing film in the recessed feature to a level that is below a field region of the dielectric layer; and
   e) filling the recessed feature using at least one of CVD and ALD.

2. The method of claim 1, wherein (b) includes filling the recessed feature with the tungsten-containing film such that an opening of the recessed feature is pinched off.

3. The method of claim 1, wherein (b) includes filling the recessed feature with the tungsten-containing film such that an opening of the recessed feature is closed and overburden is deposited on a field of the substrate.

4. The method of claim 1, wherein (c) is performed in one of a CVD chamber and an etch chamber.

5. The method of claim 1, wherein the underlying material includes a liner/barrier layer.

6. The method of claim 2, wherein the liner/barrier layer includes one of titanium and tantalum.

7. The method of claim 2, wherein the liner/barrier layer includes one of titanium, titanium nitride, tantalum nitride, and $TiC_xN_x$.

8. The method of claim 1, further comprising performing chemical mechanical planarization (CMP) of the substrate after (e).

9. The method of claim 1, wherein the predetermined temperature is less than or equal to 100° C.

10. The method of claim 1, wherein the predetermined temperature is less than or equal to 50° C.

11. The method of claim 5, wherein the liner/barrier layer includes an overhang that creates a pinch point at an opening of the recessed feature.

12. The method of claim 1, further comprising adding one or more of nitrogen, oxygen, hydrogen, helium, argon, or fluorine to slow etching of the liner/barrier layer.

13. The method of claim 5, further comprising oxidizing the liner/barrier layer prior to (b).

14. The method of claim 1, wherein the level is closer to the bottom of the recessed feature than to the field region of the dielectric layer after the first iteration of (c).

15. A method for filling a recessed feature of a substrate, comprising:
   a) providing a substrate including a dielectric layer, a liner/barrier layer, and a recessed feature,
   b) oxidizing the liner/barrier layer;
   c) at least partially filling the recessed feature of the substrate with tungsten-containing film using at least one of chemical vapor deposition (CVD) and atomic layer deposition (ALD);
   d) at a predetermined temperature less than or equal to 150° C., using an etchant including activated fluorine species to selectively etch the tungsten-containing film in the recessed feature at an etch rate that is higher than an etch rate of the liner/barrier layer, and wherein the etching removes the tungsten-containing film in the recessed feature, and the etching exposes at least a portion of the liner/barrier layer in the recessed feature and does not remove all of the tungsten-containing film at a bottom of the recessed feature;
   e) repeating c) and d) one or more times, wherein during a first iteration of (d) the etching removes the tungsten-containing film in the recessed feature to a level that is below a field region of the dielectric layer; and
   f) at least partially filling the recessed feature using at least one of CVD and ALD.

16. The method of claim 15, wherein the level is closer to the bottom of the recessed feature than to the field region of the dielectric layer after the first iteration of (d).

* * * * *

UNITED STATES PATENT AND TRADEMARK OFFICE
CERTIFICATE OF CORRECTION

| | | |
|---|---|---|
| PATENT NO. | : 8,883,637 B2 | Page 1 of 1 |
| APPLICATION NO. | : 13/536095 | |
| DATED | : November 11, 2014 | |
| INVENTOR(S) | : Esther Jeng et al. | |

It is certified that error appears in the above-identified patent and that said Letters Patent is hereby corrected as shown below:

In the Specification:
Column 1, Line 66            Delete "10," and insert --1D,--

In the Claims:
Column 12, Line 19, Claim 15     Delete "feature," and insert --feature;--
Column 12, Line 29, Claim 15     Delete "layer," and insert --layer--

Signed and Sealed this
Thirty-first Day of March, 2015

Michelle K. Lee
*Director of the United States Patent and Trademark Office*